(12) United States Patent
Knickerbocker et al.

(10) Patent No.: US 11,710,669 B2
(45) Date of Patent: Jul. 25, 2023

(54) PRECISION THIN ELECTRONICS HANDLING INTEGRATION

(71) Applicant: International Business Machines Corporation, Armonk, NY (US)

(72) Inventors: John Knickerbocker, Orange, NY (US); Bing Dang, Chappaqua, NY (US); Qianwen Chen, Chappaqua, NY (US); Joshua M. Rubin, Albany, NY (US); Arvind Kumar, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/882,624

(22) Filed: May 25, 2020

(65) Prior Publication Data

US 2021/0366789 A1 Nov. 25, 2021

(51) Int. Cl.
*H01L 21/66* (2006.01)
*H01L 25/00* (2006.01)
(Continued)

(52) U.S. Cl.
CPC .......... *H01L 22/20* (2013.01); *H01L 25/0657* (2013.01); *H01L 25/18* (2013.01);
(Continued)

(58) Field of Classification Search
CPC ....... H01L 23/5226; H01L 2224/02372; H01L 2224/05009; H01L 2224/05025; H01L 2224/05087; H01L 2224/0509; H01L 2224/0557; H01L 2224/13009; H01L 2224/13025; H01L 2224/16146; H01L 2224/18–225; H01L 2224/82–82986; H01L 2224/023–024; H01L 2225/06541–06544; H01L 2225/06503–0659; H01L 25/043; H01L 25/0657; H01L 25/074; H01L 25/0756; H01L 24/18–25; H10B 80/00; H10K 19/00; H10K 39/10; H10K 59/90;
(Continued)

(56) References Cited

U.S. PATENT DOCUMENTS 8,419,895 B2 4/2013 Dang et al.
9,029,238 B2 5/2015 Andry et al.
(Continued)

*Primary Examiner* — Victor A Mandala
*Assistant Examiner* — Lawrence C Tynes, Jr.
(74) *Attorney, Agent, or Firm* — Daniel Morris; Otterstedt & Kammer PLLC

(57) ABSTRACT

One or more die stacks are disposed on a redistribution layer (RDL) to make an electronic package. The die stacks include a die and one or more Through Silicon Via (TSV) dies. Other components and/or layers, e.g. interposes layers, can be included in the structure. An epoxy layer disposed on the RDL top surface and surrounds and attached to all the TSV die sides and all the die sides. Testing circuitry is located in various locations in some embodiments. Locations including in the handler, die, TSV dies, interposes, etc. Testing methods are disclosed, Methods of making including "die first" and "die last" methods are also disclosed. Methods of making heterogenous integrated structure and the resulting structures are also disclosed, particularly for large scale, e.g. wafer and panel size, applications.

19 Claims, 10 Drawing Sheets

(51) Int. Cl.
*H01L 25/065* (2023.01)
*H01L 25/18* (2023.01)

(52) U.S. Cl.
CPC .... *H01L 25/50* (2013.01); *H01L 2225/06513* (2013.01); *H01L 2225/06541* (2013.01)

(58) Field of Classification Search
CPC ........ H10K 59/95; H10K 59/00; H10K 65/00; H10N 19/00; H10N 39/00; H10N 69/00; H10N 79/00; H10N 9/00
See application file for complete search history.

(56) References Cited

U.S. PATENT DOCUMENTS

| | | | |
|---|---|---|---|
| 9,324,601 | B1 | 4/2016 | Allen et al. |
| 9,379,091 | B2* | 6/2016 | England ................. H01L 22/10 |
| 9,401,584 | B1 | 7/2016 | McLaurin et al. |
| 9,601,364 | B2 | 3/2017 | Allen et al. |
| 9,679,796 | B2 | 6/2017 | Arvin et al. |
| 9,691,747 | B1 | 6/2017 | Dang et al. |
| 9,748,131 | B2 | 8/2017 | Allen et al. |
| 9,893,047 | B2 | 2/2018 | Dang et al. |
| 9,947,570 | B2 | 4/2018 | Andry et al. |
| 2014/0353815 | A1* | 12/2014 | England ................. H01L 21/56 257/712 |
| 2016/0133486 | A1 | 5/2016 | Audry et al. |
| 2017/0179096 | A1 | 6/2017 | Dang et al. |
| 2018/0113969 | A1 | 4/2018 | Chen et al. |
| 2021/0305226 | A1* | 9/2021 | Tsai ................... H01L 25/0657 |
| 2022/0077063 | A1* | 3/2022 | Haba .................. H01L 23/5383 |

* cited by examiner

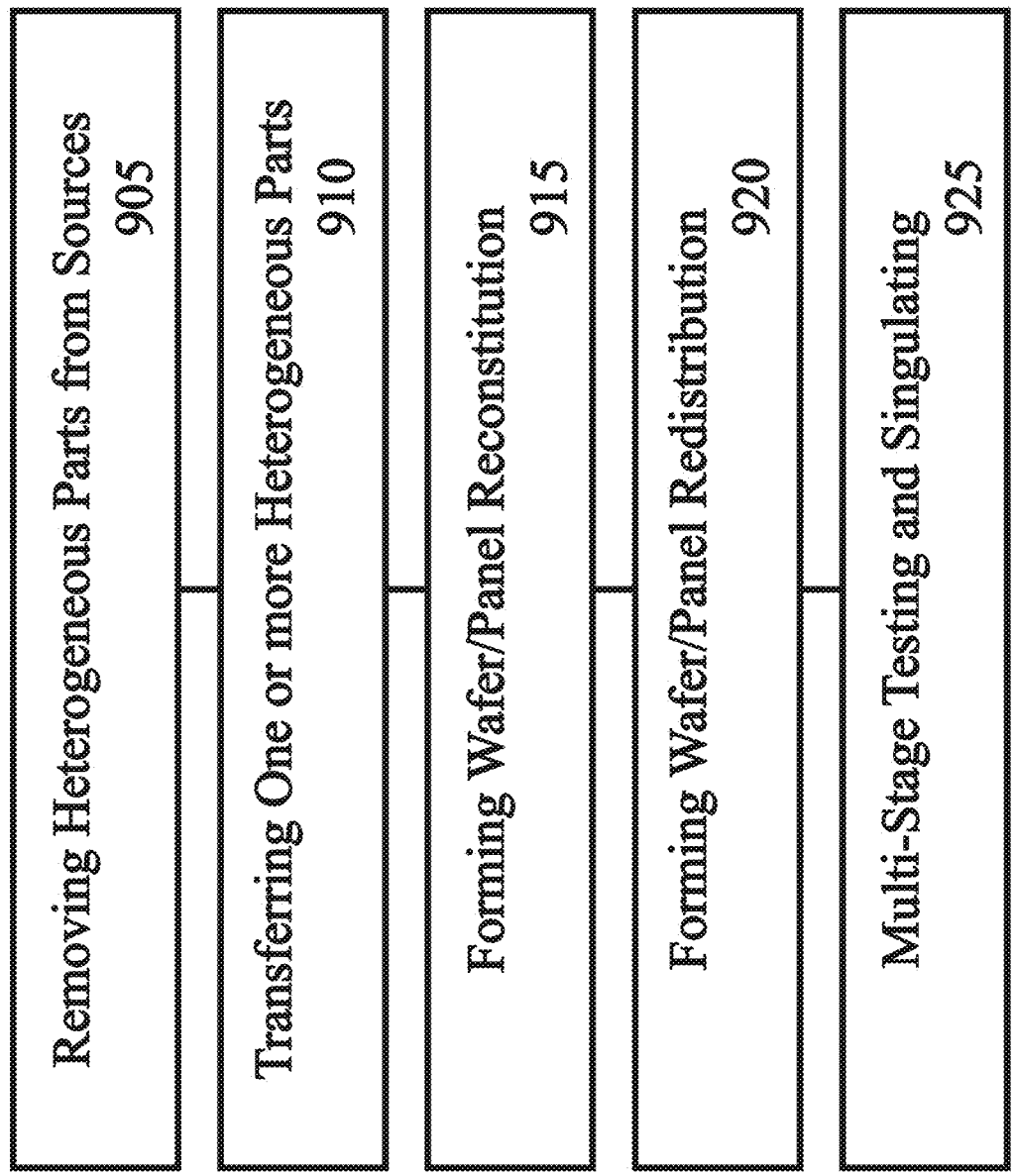

PRECISION THIN ELECTRONICS HANDLING INTEGRATION

BACKGROUND

The present invention relates to semiconductor apparatus and methods used in semiconductor manufacturing. More specifically, the invention relates to handling and assembling thin dies, chips, chiplets, interposers, bridges, and components at large scale, e.g. wafer and panel level, and testing parts at multiple stages of assembly.

During manufacturing and assembly of semiconductor circuitry, small, thin, and delicate parts need to be held, positioned, and generally handled while going through multiple process steps. These semiconductor parts include wafers, dies, chips, chiplets, redistribution layer(s) (RDL), dielectric layers, dielectric through via (DTV) arrays, semiconductors, semiconductor packages, interposers, bridges, components (e.g. capacitors, light emitting diodes-LEDs, vertical-cavity surface-emitting lasers-VCSEL), etc.

The prior art attaches temporary handles or handlers to one or more parts to add stability, support, and/or stiffness to the part(s) while the parts are moved and processed. The handlers are temporarily bonded to the part(s) during processing and assembly steps and then released later with some debonding technique. By moving the larger handler with the part(s) attached, the parts can be very accurately position during manufacturing and processing while maintaining the physical integrity of the part(s).

For example, handlers can be made with a transparent (at certain electromagnetic frequencies) substrate, like glass or silicon, bounded to the part(s) with a temporary adhesive or bonding layer, and de-bonded by selectively ablating the temporary adhesive with a laser that passes through the transparent handle, e.g. at room temperature. Laser frequencies can be in the infrared (IR) range when debonding a silicon handle or in the ultraviolet (UV) range when using a glass handler. Solid state lasers with a UV wavelength of 355 nanometers (nm) and scanning beam equipment are commonly used for debonding.

However, prior art techniques have difficulty handling the finer pitch interconnections, stacking multiple thin chips/dies, working at larger scales (e.g. wafer and panel level), and integrating heterogeneous parts. These operations are needed for new applications like artificial intelligence (AI), high bandwidth memory (HBM), mobile computing, high performance computing, cloud computing, wired and wireless communications, smart phones, internet of things (IoT), etc.

In these applications, heterogeneous smaller and thinner parts with finer pitch connections need to be assembled at higher scales, e.g. at the wafer and panel level. At these large scales, a failure of one small part and/or connection can render an entire assembly, package, or module as worthless. For example, a failed inexpensive part or a faulty connection in a package or module can make worthless the entire cost of an expensive part (like central processing units, CPUs; multi-core processors; graphical processing units, GPUs; accelerators, memory chips, one or more memory stacks such as high bandwidth memory (HBM), memory such as hierarchy of cache chips or chiplets, and field programmable gate arrays, FPGAs) integrated into assembly, package, or module.

There is a need for electronic package and module structures with fine pitch interconnections, thin and small stacked dies, and heterogeneously integrated parts made, assembled, and tested by methods suitable to large volume production using large scale (wafer and panel level) assemblies sourced from multi-vendor supply chains.

SUMMARY

One embodiment of the present invention is an electronic package having a redistribution layer (RDL). The RDL has one or more RDL top external contacts on a RDL top surface, one or more RDL bottom external contacts on a RDL bottom surface, one or more RDL singulation edges, and one or more fanout connections in the RDL. The fanout connections connect one or more of the RDL top external contacts to one or more of the RDL bottom external contacts.

One or more die stacks are disposed on the RDL. The die stack is one or more stacked Through Silicon Via (TSV) dies, e.g. stacked in a TSV stack, connected to a die. The TSV dies have one or more TSV top external contacts on a TSV top surface, one or more TSV bottom external contacts on a TSV bottom surface, and one or more TSV die sides. The die has a die top surface, one or more die bottom external contacts on a die bottom surface, one or more die sides, and one or more die circuitries within the die. The die is disposed on and connects to a top TSV die, in the TSV stack. A RDL TSV die is on the bottom of the TSV die stack and is connected to the RDL. (In a single TSV die, TSV stack the RDL TSV die and the top TSV die are the same.)

All the TSV dies have one or more vias running from the TSV top surface to the TSV bottom surface. The die may or may not have vias running through them. In addition, through redistribution layer vias (TRLV) and/or through mold vias (TMV) may add vertical electrical and/or thermal connections to one or more die or components or stacked die to support power delivery, signal communications and/or thermal transport in addition to/or as an alternative to/or as a compliment to TSV connections.

An epoxy layer is disposed on the RDL top surface and surrounds and attaches to all the TSV die sides and all the die sides. The epoxy layer or polyimide layer or molding compound layer or alternate materials may support RDL wiring with one or more signal communication layers, one or more reference plane layers and each with vertical vias and/or through RDL vias (TRLV) or through mold vias (TMV) to support electrical signal, power and/or thermal interconnections. A sealing layer, heat transfer layer, a thermal interface material, a solder material and/or alternate material may also be deployed to interconnect the die(s), die stack(s), the components, the packaging to a thermal cooling device such as a heat spreader, module cap or lid, a integrated thermal cooling component for air or liquid cooling or alternate thermal cooling structure.

In some embodiments, testing circuitry is in various locations, including the handler, die, TSV dies, interposers, and/or bridges, etc. Testing methods, methods of making (including "die first" and "die last" methods), and methods of making heterogenous integrated structure and the resulting structures are disclosed, particularly for large scale applications.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

FIG. 9 is a flow chart of a process for making packages/modules with heterogeneous parts from multiple sources.

DETAILED DESCRIPTION

Figure 1:
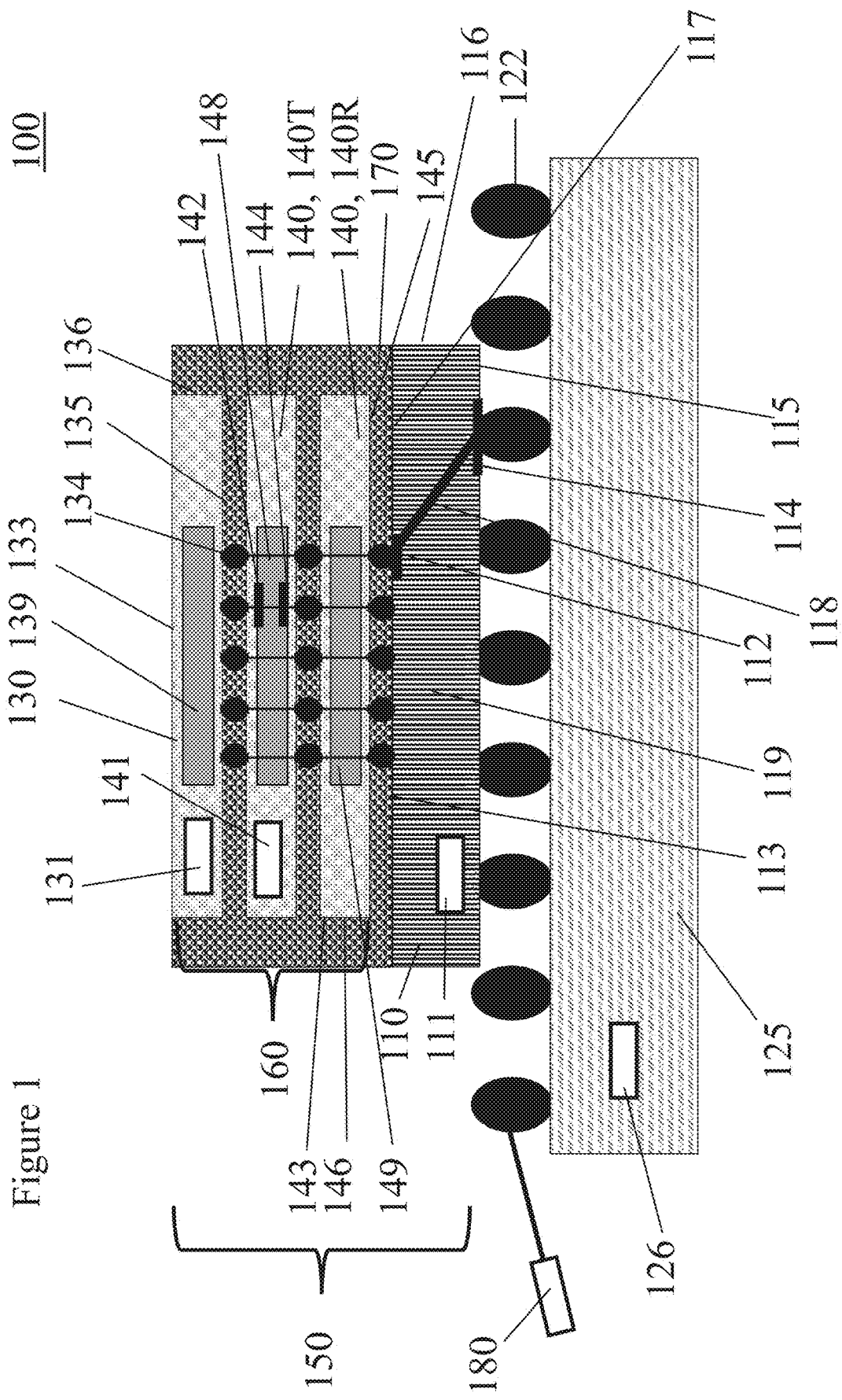
FIG. 1 is a block diagram of an electronic package (package) attached to a handler.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Embodiments of the invention receive heterogeneous parts from one or more source wafers/panels. The source wafers/panels come from different suppliers and/or supply chain sources. The parts on one of the source wafer/panels may be of the same type of part and/or perform the same function as the parts on another source wafer/panel, or not. One or more parts (or groups of parts) from these different wafers/panels are removed (e.g. singulated or debonded) and reconstituted on a reconstitution wafer/panel. In wafer reconstitution, one or more of these parts and/or groups of removed parts is positioned at a location on the reconstituted wafer/panel with a particular orientation. Then the removed part(s) and/or part group(s) are placed on and attached to the reconstituted wafer, e.g. on a layer of adhesive.

Redistribution wafers/panels are created by adding one or more redistribution layers (RDLs) on the reconstituted wafer/panel. The RDLs are one or more layers of connections that connect to connections on one or more of the parts on the wafer/panels.

Note that the wafer/panel reconstitution and the wafer/panel redistribution can happen in any order. For example, wafer reconstitution can be followed by wafer redistribution. Alternatively, wafer distribution can be followed by wafer reconstitution.

These wafers/panels are large. For example, wafers have dimensions on the order of 200 to 300 millimeters (mm). Panels are larger with dimensions on the order of 300 to 600 mm with surface areas 4 times or more those of wafers. Processing/assembly on these large wafers is called Wafer Level Processing (WLP) and processing/assembly on panels is called Panel Level Processing (PLP).

Some parts placed on these reconstituted/redistributed wafers/panels have very fine pitched external connections. In some embodiments, these fine pitch external connections connect to wiring in the RDL, interposers, and/or bridges which "fan out" the fine pitch connections to connections with a courser pitch. The fanning out permits one or more of the fine pitch parts to be connected to other circuitry with micron or submicron precision using a course, and cheaper, connection. Fanning out on these large wafers is called Fan Out Wafer Level Processing (FOWLP).

Many applications use expensive parts integrated with cheaper parts. Some integrated parts have different functions and/or come from different suppliers. These heterogeneous parts are integrated together during assembly on the wafers/panels to create one or more packages. Modules made of one or more packages and/or other parts also can be assembled on the wafers/panels. Failure of a part and/or a connection at any point in the assembly can render the entire package and/or module useless. Accordingly, the entire cost of expensive parts in these failed packages/modules can be lost for a failed connection and/or minor part.

In some embodiments, part testing is done before assembly. For example, one or more parts is tested by testing circuitry built in. Built in Self Testing (BIST) is performed on some parts before the part is assembled on the wafer/panel. For instance, BIST insures that only Known Good Dies (KGD) are used before being assembled WLP/PLP. However, BIST is not enough when doing WLP or PLP. A package or module can fail for any number of reasons, even if the individual parts in the assembly are functioning.

In some embodiments, testing is performed at multiple stages (multi-stage testing) during the assembly process. To perform this multi-stage testing, one or more testing circuits are embedding and/or incorporated within one or more parts in the assembly. For example, test circuits can be located within the handler, one or more of the dies, one or more of the TSV dies, the RDL, one or more of the interposer layers, one or more of the bridges, and one or more external probes.

Tests are performed at multiple, different times during the assembly process. Non-limiting examples of testing times include after disposing the RDL, after connecting one or more TSV dies, after connecting one or more dies, after connecting one or more interposing layers, after connecting one or more components, and after attaching one or more heat dissipation devices.

In some embodiments, different types of tests are performed. Non-limiting examples of test types include a: full functional test, partial function test, statistical test, optical communication test, subset test testing one or more components, subset test testing one or more TSV dies, subset test testing one or more dies, heat transfer test, "as-built" package test, full package test, and full module test.

When a test determines that one or more parts and/or connections have failed, one or more corrective actions is taken in the assembly process. Non-limiting examples of corrective actions include removing a failed die, TSV die, interposer, or component; replacing a failed die, TSV die, interposer, or component; and working around a failed die, TSV die, interposer, or component.

Removal of a part can be performed by known selective laser removal/release and/or debonding techniques.

Known good components can be substituted for defective components during the WLP and PLP and can be integrated into the partial assembly at different stages of the assembly and testing.

"Work arounds" include leaving the failed part and/or connection in place but not connecting the fail part/connection to anything in the package/module or not transferring a part from a source wafer/panel to another wafer/panel. Software solutions include re-writing code so the failed part/connection is not used/addressed.

Some parts like CPUs, GPUs, are FPGAs, add a large part of the expense to the package/module. Some of these parts can have 10's or even 100's of cores and are used in applications like image processing and facial recognition.

In some embodiments, the assembly and/or testing is sequenced so that the more expensive parts are assembled last. In addition, multi-stage testing is performed to ensure each part and connection and/or the assemblies of these heterogeneous parts is fully functional before the more expensive parts are assembled.

Refer now to the Figures.

FIG. 1 is a block diagram 100 of an electronic system or package (package) 150 attached to a handler 125.

The package 150 has a redistribution layer (RDL) 110 connected to a die stack 160 and/or other parts. The RDL 110 has one or more RDL top external contacts, typically 112 on a RDL top surface 113, one or more RDL bottom external contacts, typically 114, on a RDL bottom surface 115, and one or more RDL singulation edges 116. In some embodiments, the RDL 110 has fan out connections 118 that connect one or more finer pitch RDL top external contacts 112 with one or more courser pitch RDL bottom external contacts 114. The fan out connections 118 "spread out" to the course RDL bottom surface contacts 114 to make external connections to the RDL top external contacts 112 easier. In some embodiments, RDL test circuits 111 are embedded in the RDL. RDL circuitry 119 and/or RDL components 119, e.g. capacitors, etc., are included in the RDL layer 110. In some embodiments, the RDL circuitry 119 is formed by known deposition, lithographic, and layering processes.

One or more die stacks 160 are connected to and disposed on the RDL 110. A die stack 160 can have a single die 130. The single die 130 has a die top surface 133, one or more die bottom external contacts 134 on a die bottom surface 135, one or more die sides 136, and one or more die circuitries 139 within the die 130. In some embodiments, one or more of the die bottom external contacts 134 is connected to one or more of the RDL top external contacts 112. If C4 connections are used, the C4 connections can be either the die bottom external contacts 134 and/or the RDL top external contacts 112. In some embodiments, the die 130 contains one or more die test circuits 131. The die test circuits 131 can be used for BIST and/or multi-stage testing as described in more detail below.

In alternative embodiments, the package 150 has a die stack 160 of one or more Through Silicon Via (TSV) dies 140 on which the die 130 is disposed. In some embodiments there is a single TSV die 140 disposed between the RDL 110 and the die 130. In other embodiments there are multiple TSV dies 140 disposed one upon the other in a TSV die 140 stack (240 in FIG. 2). The top-most TSV die 140 abutting and connecting to the die 130 is a top TSV die (140, 140T). The bottom-most TSV die 140 abutting and connected to the RDL 110 is a RDL TSV die (140, 140R). In the case where there is only one TSV die 140 the top TSV die (140, 140T) and the RDL TSV die (140, 140R) are the same.

Each of the TSV dies 140 has TSV top external contacts 142 on a TSV top surface 143, one or more TSV bottom external contacts 144 on a TSV bottom surface 145, one or more TSV die sides 146, and one or connections TSV internal connections 149 connecting to one or more of the TSV top external contacts 142 and one or more of the TSV bottom external contacts 144. The TSV dies 140 have one or more TSV 148 that extend through the TSV die 140 from the TSV bottom surface 145 to the TSV top surface 143. The TSVs 148 may or may not connect to a TSV top external contact 142 and/or a TSV bottom external contact 144.

In some embodiments, one or more of the TSV dies 140 contains one or more TSV die test circuits 141. The TSV die test circuits 141 can be used for BIST and/or multi-stage testing as described in more detail below.

In the case of the RDL TSV die (140, 140R), the RDL TSV die (140, 140R) is disposed on the RDL and one or more of the RDL TSV bottom external contacts 144 physically and electrically connected to one or more corresponding RDL top external contacts 112. In addition, one or more of the RDL TSV die (140, 140R) top external contacts 142 connects to either: 1. one or more of the die bottom external contacts 134 or 2. one or more TSV bottom external contacts 144 on a TSV die 140 above. In the latter case, the RDL TSV die (140, 140R), e.g. a first TSV die 140 is connected to one more TSV bottom external contacts 144 of the TSV die 140 above.

In this way one or more TSV dies 140 can be stacked one upon the other to create a TSV die stack 240 upon which a die 130 is disposed and connected to form the die stack 160. In some embodiments, the TSV dies 140 are stacked one upon the other, a first TSV die 140 having one or more TSV die 140 top external contacts 142 connected to one or more TSV die 140 bottom external contacts 144 of a second TSV die 140 disposed on and physically and electrically connected to the first TSV die 140.

As another non-limiting example, in the case of the top TSV die (140, 140T), the top TSV die (140, 140T) has one or more TSV top external contacts 142 physically and electrically connected to one or more corresponding die bottom external contacts 134.

Note that a TSV die 140 always have one or more TSVs 148 passing through, however, the die 130 may or may not have TSVs.

In some embodiments, the die(s) 130 have a thickness between 30 micrometers (um) and 1000 um and/or TSV die(s) 140 have a thickness between 20 um and 100 um and generally less than 60 um.

An epoxy layer 170 is disposed on the RDL 100 top surface 117, e.g. during one or more wafer reconstitution steps described below. The epoxy layer 170 surrounds and is attached to all the TSV die sides 146 and all the die sides 136.

The metalized dielectric layer(s) such as Cu/epoxy layer(s), Cu/polyimide layer(s), molding layer(s), Cu/SiO2 or SiN/SiO2 or other hard dielectrics or alternate materials or combinations therein 170 adds strength and stability to the package 150 and allows later processing steps to occur without damaging the thin fragile dies 130 and TSV dies 140. The Cu/dielectric layer(s) is (are) applied using known techniques like thin film wiring build up layers such as spin on dielectric, cure, spin on resist layer, lithography/pattern imaging, etch for wiring and vias followed by Cu plating and chemical mechanical polish and repeat for additional layers: or alternatively dielectric deposition such as photo-sensitive polyimide and cure, lithography/pattern imaging and etch for wiring and vias or for wiring only followed by laser via formation, followed by copper plating for wiring and vias and chemical mechanical polish and repeat for added layer(s) with wiring or for added dielectric layer(s) with vias only. Numerous other examples of use of dielectric, epoxy, polyimide, molding material and wiring and vias formation can be described as sequential build up layers Alternately one or more build up layers, copper pillar connecting structures in arrays or in dielectric or molding material can be fabricated and transfer joined to the structures. Other examples can be found in industry such as one or more layers of single or dual damascene built structures.

The epoxy layer 170 can be applied as one layer after all the dies 130 and TSV dies 140 are assembled or can be applied in multiple layer applications, e.g. after each of one or more of the TSV dies 140 and/or dies 130 are assembled.

The handler 125 is temporarily attached to the package 150, e.g. by bonding/de-bonding layer (not shown) and/or by electrically and physically connecting to the RDL 110 through the handler contacts 122. Note that in some embodiments, the handler contacts 122 can be attached originally to the RDL 110, e.g. as RDL bottom external contacts 114 and/or as C4 contacts attached to the RDL bottom external contacts 114. The handler 125 can be made of known materials, e.g. silicon or glass, to facilitate bonding/debonding with the package 150. Note in some embodiments, no handler contacts 122 are used between the RDL and the handle wafer but only a release layer adjacent to the handle wafer or a release layer adjacent to the handle wafer and an adhesive layer to attach the RDL, organic interposer(s), Si interposers(s) or alternate base structure for subsequent build, assembly and/or test and or thermal structures and or interconnection structures.

The "handle platforms" may be wafer form factors or panel form factors when using glass or silicon handle materials with examples being fan-out wafer level processing and fan-out panel level processing. Other "handling platforms" can also be used in different "handling platform" form factors and structures such as dicing tape (single sided or double sided), dicing tape on dicing tape frame (with or without an underlying support wafer or panel) or dicing tape or adhesive on handle wafers, handle panels, metal frames, or gel-paks. Note a compatible dicing tape, adhesive tape or alternate adhesive or release layer and adhesive material on the above form factors, or alternate form factors should be comprised of a material selected for appropriate release layer and/or adhesive layer parameters, such as but not limited to process compatibility, integration compatibility, test compatibility, mechanical integrity, planarity, and release compatibility either prior to or after integration and/or test.

In some embodiments, one or more handler test circuits 126 are included in the handler 125. The handler test circuits 126 are used in the multi-stage testing. Alternative multi-stage testing methods include using a testing probe 180 that can be attached to one or more external connections, e.g. connections 122 on the handler 125 during one or more stages of the assembly. The testing probe 180 can also monitor one or more connections (e.g. 112, 142, 144, 148, and 134) on the die 130 and/or TSV dies 140 during one or more of the assembly stages.

Note that FIG. 1 shows one embodiment of the handler 125 attached to the package 150, e.g. in a "die last" example. Handlers 125 can also be attached to the die top surface 133 of one or more of the dies 130 in other configurations/ assembly methods like "die first". In addition, other configurations are envisioned. For example, one or more packages 150 can be on the handle 125. The packages 150 can have different numbers of dies (130, 140) in their die stacks 160. Interposers and bridges are envisioned in some configurations. Components, single dies 130, and/or other parts can be placed on the handler 125, e.g. in a side by side configuration. There can be groupings (or patterns) of packages 150, dies 130, components (not shown), and/or other parts that are repeated periodically on the handler 125. Some of these configurations are discussed below.

Figure 2:
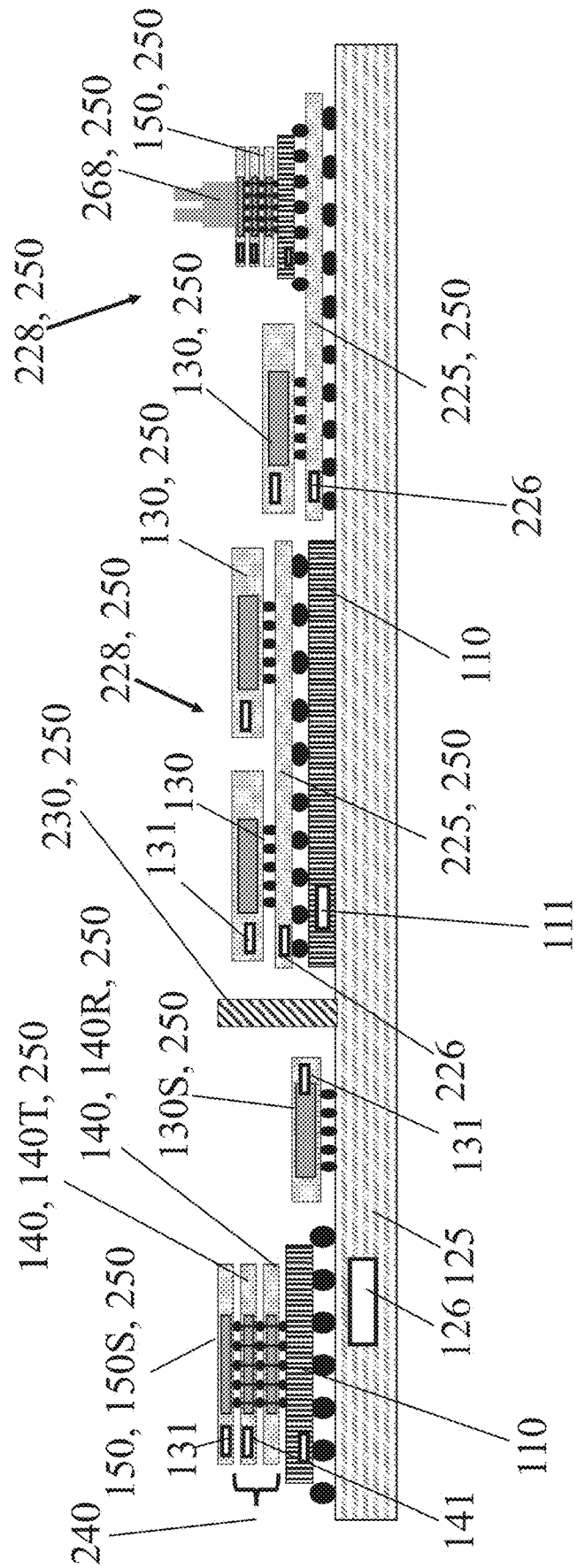
FIG. 2 is a block diagram showing alternate configurations of packages, dies, components, and/or other parts configured on a handler.

FIG. 2 is a block diagram 200 showing alternate configurations of packages 150, dies 130, TSV dies 140, components 230, and/or other parts (e.g. 150, 150S, 130, 130S, 230, and 225), typically 250, configured on a handler 125. Again, test circuitry (e.g. 111, 126, 131, 141, and 226) can be located in one or more of the parts 250.

For example, die stack (150, 150S, 250) is disposed adjacent to die (130, 130S, 250) on the handler 125 in a "side-by-side" configuration. These side-by-side parts can be connected later, e.g., through a layer disposed RDL (not shown). Alternatively, the side-by-side parts 250 can be connected by an RDL between them and the handler 125 (not shown), and/or otherwise. The epoxy layer 170 (not shown for clarity) can be disposed after the parts 250 are placed in a different location or while on the handler 125.

Components (230, 250) can also be disposed on the handler 125 and/or on one or more RDLs 110. Non-limiting examples of components (230, 250) include active parts 250, passive parts 250, capacitors, light emitting diodes-LEDs, vertical-cavity surface-emitting lasers-VCSEL, Cu pillar arrays, dielectric through via (DTV) arrays that can support power delivery, signal interconnection, thermal interconnection, mechanical interconnection/integrity components, electrical interconnection components, voltage regulation, optical interconnection components, I/O switch chips, chiplets, thermal cooling devices, thermal spreaders, thermal lids, thermal transfer components, or sealing caps, etc.

Another example of a side-by-side configuration (150S, 130S) is shown on an interposer configuration (228, 250) where two or more parts 250 are disposed on and connected to one or more interposers (225, 250). An interposer configuration (228, 250) has one or more parts having one or more connections to one or more interposers (225, 250). The interposer(s) (225, 250) can be a layer with one or more internal connections. Interposers (225, 250) include bridges (225, 250) that have high speed and/or high-density connections, e.g. such as silicon bridges (225, 250). In some embodiments, the interposer(s) (225, 250) are disposed on a RDL 110. Again, test circuitry (e.g. 111, 131, 141) can be located in one or more of the parts 250. Test circuitry includes interposer 225 test circuitry 226 in one or more of the interposer(s)/bridges 225.

Multiple embodiments of interposer (225, 250) configurations 228 are envisioned, including but not limited to, one or more interposers 225 disposed and/or connected as follows: between two TSV dies 140 in a first die stack 150 within the epoxy layer, between a TSV die 140 and a die 130 in a first die stack 150 within the epoxy layer 170, between the RDL 110 and a TSV die 140 within the epoxy layer 170, between the RDL 110 and a die 130 within the epoxy layer 170, connecting a first TSV die 140 and in a first die stack 150 and an adjacent TSV die 140 in an adjacent die stack (150, 150S) within the epoxy layer 170, connecting a first die 130 in a first die stack (150, 150S) with an adjacent TSV 140 in an adjacent die stack (150, 150S) within the epoxy layer 170, connecting a first die 130 and an adjacent die (130, 130S) within the epoxy layer 170, and connecting a first die stack 130 and an adjacent die (130, 130S). Other interposer/bridge (225, 250) connections/configurations are envisioned.

Figure 3A:
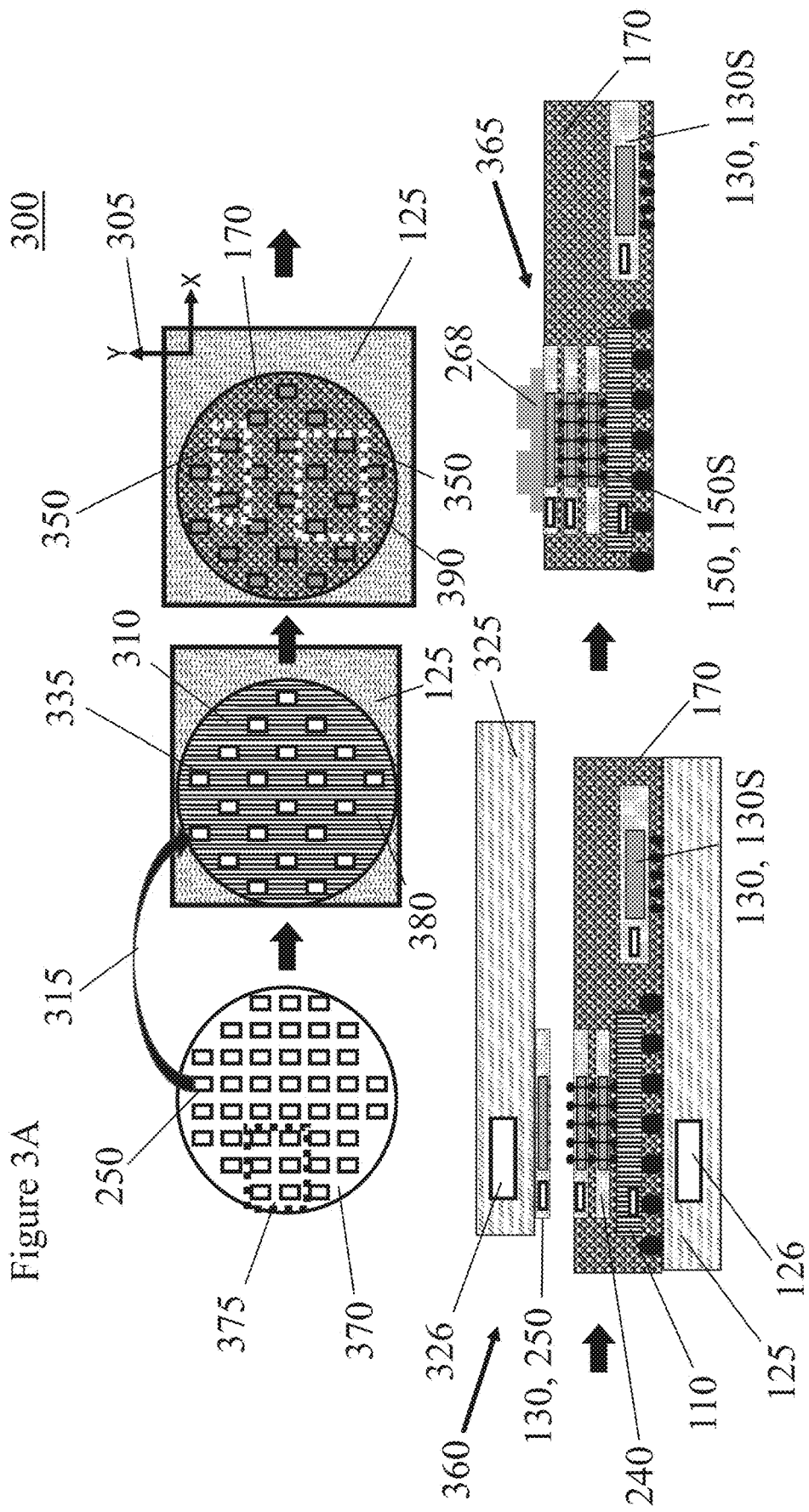
FIG. 3A is a first example of a sequence of structures showing steps in a "die last" wafer/panel reconstitution and wafer/panel redistribution process.

Additional components (230, 250) include heat dissipation devices 268. Heat dissipation devices include heat spreaders and/or heat sinks (268, 250). In some embodiments, the heat dissipation devices 268 are placed in physical and/or thermal contact with a single die 130 or a die 130 on top of a die stack 150. 1761 FIG. 3A and FIG. 3B each show examples of a sequence of structures showing steps in a "die last" (or alternatively could apply with modifications to a die first sequence of steps) 300 wafer/panel reconstitution and wafer/panel redistribution process and/or an alternate "handle support platform".

One or more source wafers 370 and/or source panels 370 have one or more parts 250. These source wafers/panels 370 can come from one or more vendors and/or supply chains. The parts 250 on these source wafers/panels 370 can be organized and/or grouped 375 on planar locations on the planar dimensions 305 of the source wafer/panels 370. In this way, individual parts 250 or groups 375 of parts 250 can be singulated and/or selected from the source wafer/panel 370. The source wafer/panel 370 can have parts 250 of the same type, e.g. all dies 130 or can have different types of parts 250, e.g. dies 130, interposers 225, TSV dies 140, and/or components 230 which can be singulated individually or in groups 375.

In a die last process, a die last wafer reconstitution 380 is placed on a handler 125, e.g. a die last or die second handler 125. A RDL 310 is formed on the die second handler 125. The RDL 310 is attached to the die second handler 125, e.g. by a de-bondable adhesive layer (not shown).

One or more parts 250 and/or part groupings (or patterns) 375 is singulated from one or more source wafers/panels 370. The singulated parts 250 and/or part groupings/patterns 375 are picked and placed 315 on the RDL 310 in the proper planar 305 location on the RDL 310 of the wafer reconstitution 380. The parts 250 and/or part groupings are singulated, selectively picked and placed, and electrically connected to corresponding connections on the RDL 310 by known methods. As a result, in some embodiments, the wafer reconstitution 380 has a wafer and/or panel level of electrically connected heterogeneous parts 250. Integration can include one or more parts all being moved at wafer handle or panel level periodic interval groupings from one wafer to another wafer or one panel to another panel or from one wafer to a panel or multiple wafers to one panel in a systematic pattern that permit multi-die, die stacks, packages, components, thermal lids, head spreaders.

As a non-limiting illustrative example is a build of multiple integrated systems, packages or electronic modules where each module has 4 multi-core die sites (i.e., 2 Central Processing Units (CPU die) and 2 Accelerator dies) and 4 die stack sites (i.e., High Bandwidth Memory (HBM) die stacks). Here, two CPU dies for each on wafer or on panel module build could be placed and bonded as a grouping/pattern 375 using a handle wafer in one handle wafer or panel transfer bonding and selective debonding release step, the two accelerator dies transferred, bonded and selectively released and four HBM stacks transfer bonded and released in one bonding/release steps as a grouping/pattern 375 (each leveraging known good die, known good module assemblies in partial build and through build completion).

Assembly 360 shows one or more parts 250 and/or part groupings 375 being singulated, picked and placed 315, and connected/attached to the wafer reconstitution 380. Assembly 360 shows a transfer handler 325, optionally including one or more transfer handler 325 test circuits 326. (In some embodiments, the transfer handler 325 also can be used as a die first handler 325, as described below.) In some embodiments, the transfer handler 325 picks and places 315 one or more of the parts 250 and/or part groupings 375 from one or more of the source wafers/panels 370 one or more times, e.g. repeatedly, until the assembly 360 is completely built 365. In this non-limiting illustration, the transfer handler 325 is transferring a die (130, 250) that is singulated, picked, positioned, placed, connected, and attached 315 on a TSV die stack 240.

Note that testing can be performed at any step/stage in the assembly of the part 365. For example, the die (130, 250) can be tested by the transfer handler 325 test circuit 326 in a BIST before the die (130, 250) is placed, connected and attached, e.g. as a KGD or known good part/part grouping/package 150. In addition, the entire assembly (either 360 and/or 365) can be tested at any stage by any of one or more of the test circuits (111, 131, 141, 126, 326, etc.)

Furthermore, the epoxy layer 170 can be disposed one or more times, e.g. after one or more part 250 and/or part groupings 375, or after the assembly 365 is completed. In the final assembly 365 example, heat dissipation devices 268 are attached in the process by the transfer handler 325 but not covered in epoxy 170 to permit better heat conduction.

After all the parts 250 and/or part groupings 375 are assembled 365 on the reconstitution wafer 380 the wafer redistribution 390 is complete. The redistributed wafer 390 can have redistributed part groupings (patterns) 350 of one or more parts 250 and/or redistributed part groupings 350. These redistributed part groupings 350 are heterogeneous integrated with parts 250 of one or more types and from one or more sources and/or supply chains. The handlers (125, 325) can be detached by known methods leaving the final redistributed part and/or part groupings (365, 350). These final redistributed parts 250 and/or redistributed part groupings (365, 350) can function as completed parts and/or be used in larger WLP and/or PLP as described herein.

These redistributed parts 250 and/or redistributed part groupings (365, 350) have high yields because of the multi-stage testing the intervention performed to remove, replace, and/or work around faulty parts before the assembly 265 is completed. For example, upon failing one or more of the tests, a corrective action (intervention) is taken that includes one or more of the following: removing a failed die, TSV die, interposer, or component (e.g. by selective singulation, debonding, or laser removal); replacing a failed die, TSV die, interposer, or component; and working around a failed die, TSV die, interposer, or component. A work around might include not connecting a faulty component, not providing power to a faulty component, and/or not addressing and/or activating a faulty component in software.

In some embodiments, the testing is performed at one or more stages in the assembly and the assembly is sequenced so the more expensive parts are connected later in the assembly. This ensures the assembly 365, package 150, and/or module "as-built", e.g. at each stage in the assembly is fully functioning before incorporating an expensive component/part 250.

Figure 3B:
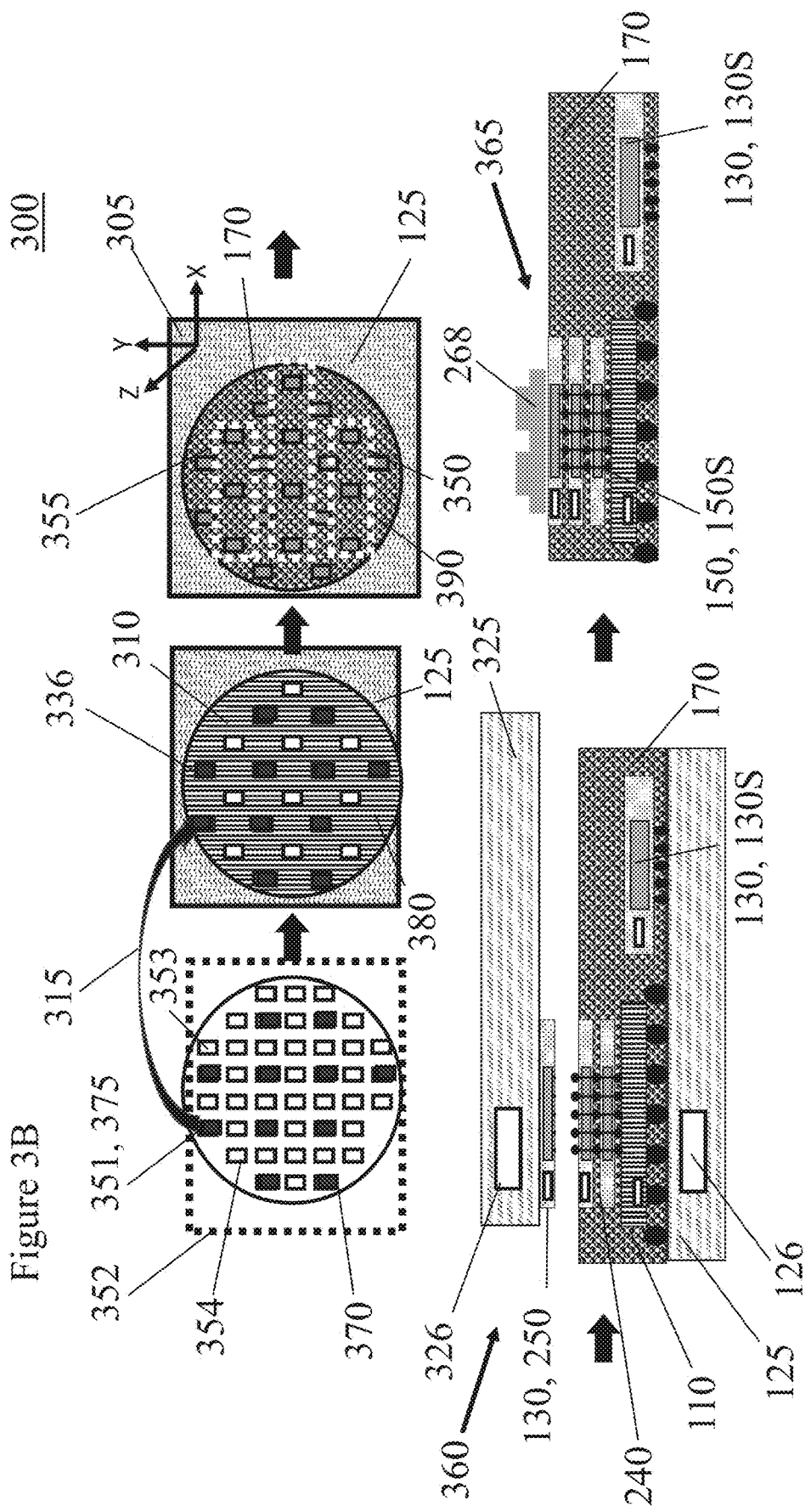
FIG. 3B is a second example of a sequence of structures showing steps in a "die last" wafer/panel reconstitution and wafer/panel redistribution process.

In an alternative embodiment, FIG. 3B can also depict the design and architecture for the use of a co-design of multiple semiconductor active and passive components comprised of similar or different component sizes and thickness. The FIG. 3B can support structures, methods and applications wherein efficient use of existing or newly designed active or passive components permit much lower cost for manufacturing fabrication, integration and/or test to support high volume and low cost heterogeneously integrated products. For example in use of multi-chip integration for Artificial Intelligence such as can be used for Cloud Computing or High performance Systems or for Mobile applications or for Internet of Things or for Network Communications, Healthcare, Automotive, or alternate applications, the ability to scale the build, assembly and test of highly interconnected and often at fine interconnection pitch with high precision, high yield and low cost have been challenging.

The FIG. 3B provides a build, test of known good die and components and integration methodology, test methodology and multi-chip/component integration platform that permits high volume build, assembly/integration and/or test or subset of these steps to achieve high volume and lower cost for these next generation of AI Heterogeneous Integrated structures and products than has heretofore been developed. The technology platform, the integration methodology and resulting package and system or subsystem structures for the above applications permit this new approach for high volume known good hardware, multi-package, multi-system and/or multi-subsystem integration. For example, 2D, 2.5D and 3D product integrated build structures are possible such as with multiple die and components being integrated with one or more, 10's, hundreds, thousands or millions of dies and components being "selectively" integrated in parallel. Note, a systematic layout for periodic spacing from build, interconnection I/O, Assembly/integration as well as option of periodic testing of known good die, components and sub-package, system or sub-system are possible to achieve this high precision (X, Y and Z) positional integration and structures. (Note placement of periodic transfer of like die using a handle platform such as a wafer or panel creates precision X, Y and Z precision tolerance control for build, integration and test.) Examples of new design, reuse of die, components, packaging for 2D, 3D, electrical power, signal interconnection, optical interconnection, mechanical integrity, thermal integrity, functional integrity, test methodology, and application function, power efficiency and reliability can benefit from this technology innovation. Die, chips, chiplet and component examples without limitation to the following list are shared such as for AI/Heterogeneous Integration applications: reuse of industry standard chips and chip stacks, chiplets, subcomponents, memory cache, memory stacks (such as High Bandwidth Memory (HBM), CPU die, GPU die, FPGA, Accelerator die, Cache memory Die, DRAM die, Input/Output (I/O switch chips, voltage regulation die or alternate semiconductor active components or passive components, thermal heat caps, spreaders, etc.

For example, in the non-limiting example of FIG. 3B, the entire source wafer 352 is chosen as the region to select the part groups/patterns of parts. A first grouping/pattern selected are the black parts, typically (351, 375). The transfer handler 325 is large enough to pick and place all the "black parts" from the entire source wafer 370 in the selected grouping (351, 375) at once. By picking this large grouping (351, 375) at the same time with the same transfer handler 325, all the parts in the grouping (351, 375) will have the same height, e.g. in the Z direction 305, and will be positioned in the same relative X-Y position 305 in the plane when placed on the wafer reconstitution 380.

All the "white parts", typically 353, in the same rows (or different rows) as the "black parts" can be picked and placed in a second transfer 315 in a similar manner (not shown). In some embodiments, these parts can have identical heights to each other but different heights from the "black parts". Parts not transferred, e.g. from rows like 354 in the source wafer 370 will leave blank spots in the wafer reconstitution 380 and/or redistributed wafer 390. These blank spots 355 can be filled by similar pick and place operations from the same source wafer 370 and/or other source wafers 370, e.g. from other manufacturers and/or wafers containing other components. These parts can be picked and placed at locations 355 (or on the wafer reconstitution 380) either individually or in groups 375.

Figure 4:
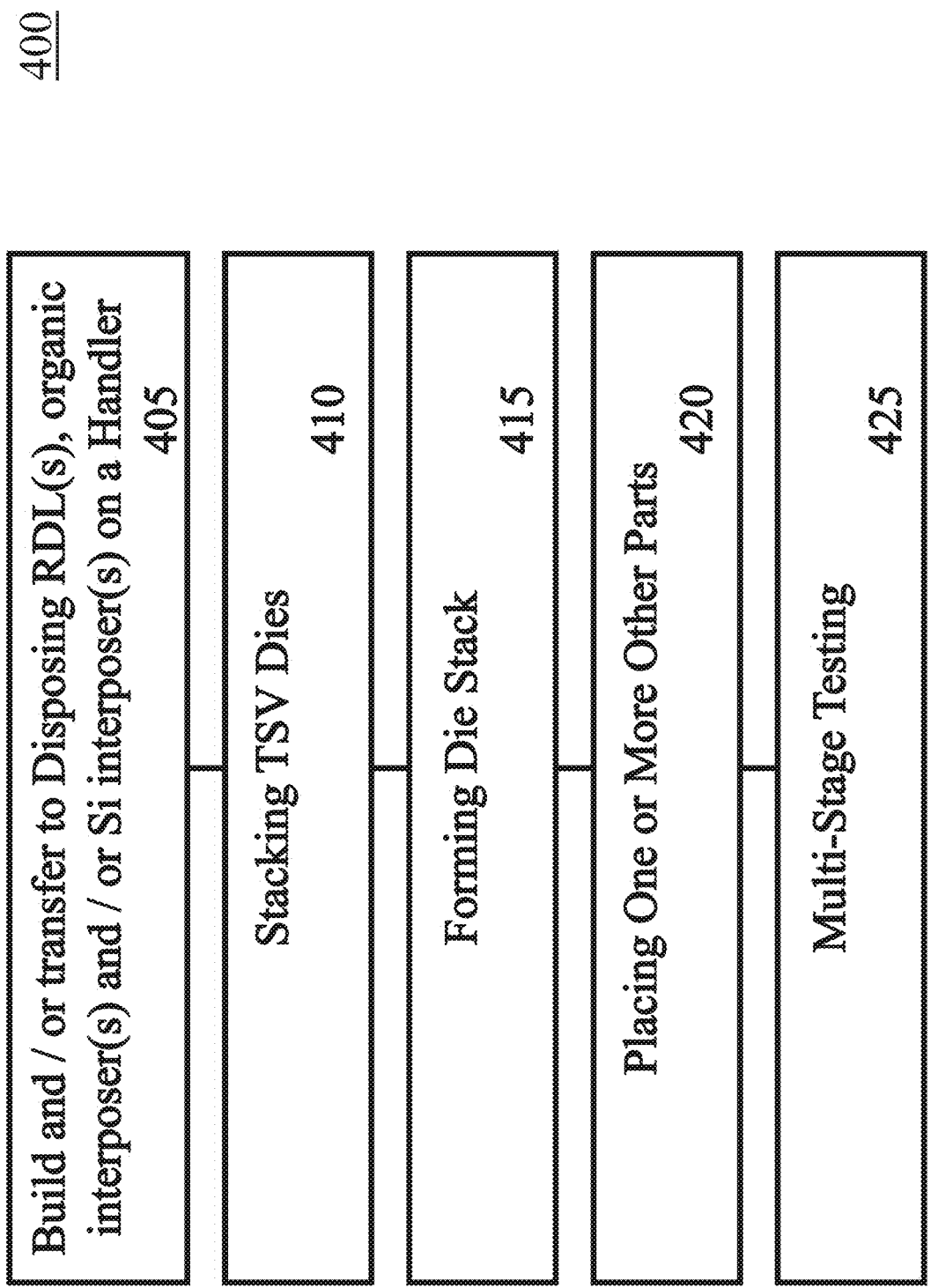
FIG. 4 is a flow chart of the steps of a "die last" wafer/panel reconstitution and wafer/panel redistribution process.

FIG. 4 is a flow chart of the steps of a "die last" wafer/panel reconstitution and wafer/panel redistribution process 400.

The chip last process 400 begins with step 405 which is disposing one or more RDLs 110 on a handler 125. In some embodiments there is a bonding layer one the handler 125. In other embodiments the RDL 110 is constructed on the handler 125 using one or more known deposition and/or lithographic techniques. In some embodiments, the RDL has one or more RDL fanout connections 118 in the RDL 110, the fanout connections 118 connect to one or more of the RDL top external contacts 112 and/or to one or more of the RDL bottom external contacts 114. In some embodiments, the fan out connections 118 "spread out" the fine top external contacts 112 to the course RDL bottom surface contacts 114 to make external connections to the RDL top external contacts 112 easier.

In step 410 one or more TSV die(s) 140 are singulated, picked and placed 315, positioned, and connected on the RDL 110. TSV die stacks 240 with one or more TSV dies 140 are formed 415 on the RDL 110. Other parts 250 are disposed on the RDL 110 as described above.

One or more die stacks 160 is formed 415 by singulating, picking and placing 315, positioning, and/or connecting a die 130 on one or more of the TSV die stacks 240.

In step 420, one or more other parts 250 including dies 130, interposers 225, bridges 225, and/or components 230 can also be disposed on the RDL 110. One or more epoxy layers 170 is disposed on the RDL 110 top surface. The epoxy layer 170 surrounds and attaches to all the TSV die 140 sides and all the die 130 sides. The epoxy layer 170 can be applied a single layer after an assembly (360, 365) is complete or near complete or at multiple times during assembly.

Multi-stage testing 425 is performed at one or more times during the wafer/panel reconstitution and wafer/panel redistribution process 400. For example, BIST is performed 425 by testing circuits (141, 131, 141, 226, etc.) embedded in one or more of the parts 250 before the part 250 is assembled. Testing 425 is also performed on one or more interim assemblies 360 after each of one or more of the parts 250 is assembled. This testing can include testing of the individual part in addition to testing the interim assembly 360 with the newly installed part 250. Alternate testing included testing of the interim assembly 360 before assembly of an expensive part 250 to ensure the expensive part 250 is not connected to a faulty interim assembly 360.

Other non-limiting examples of times that tests are performed include after disposing the RDL 110, after connecting one or more TSV dies 140, after connecting one or more dies 130, after connecting one or more interposing layers 225, after connecting one or more components 230, and after attaching one or more heat dissipation devices 268.

The same wafer/panel reconstitution and wafer/panel redistribution process 400 can be performed using parts 250 and/or part groupings 375 obtained from one or more source wafers/panels 370 and/or form redistributed parts 250 and/or redistributed part groupings 350, e.g. to create (heterogeneous) packages 150 and/or modules with heterogeneous parts.

Non-limiting examples of the tests include one or more of the following: a full functional test, a partial function test, a statistical test, an optical communication test, a subset test testing one or more components, a subset test testing one or more TSV dies, a subset test testing one or more dies, a heat transfer test, an "as-built" package test, a full package test, and a before installation of an expensive part test.

Figure 5:
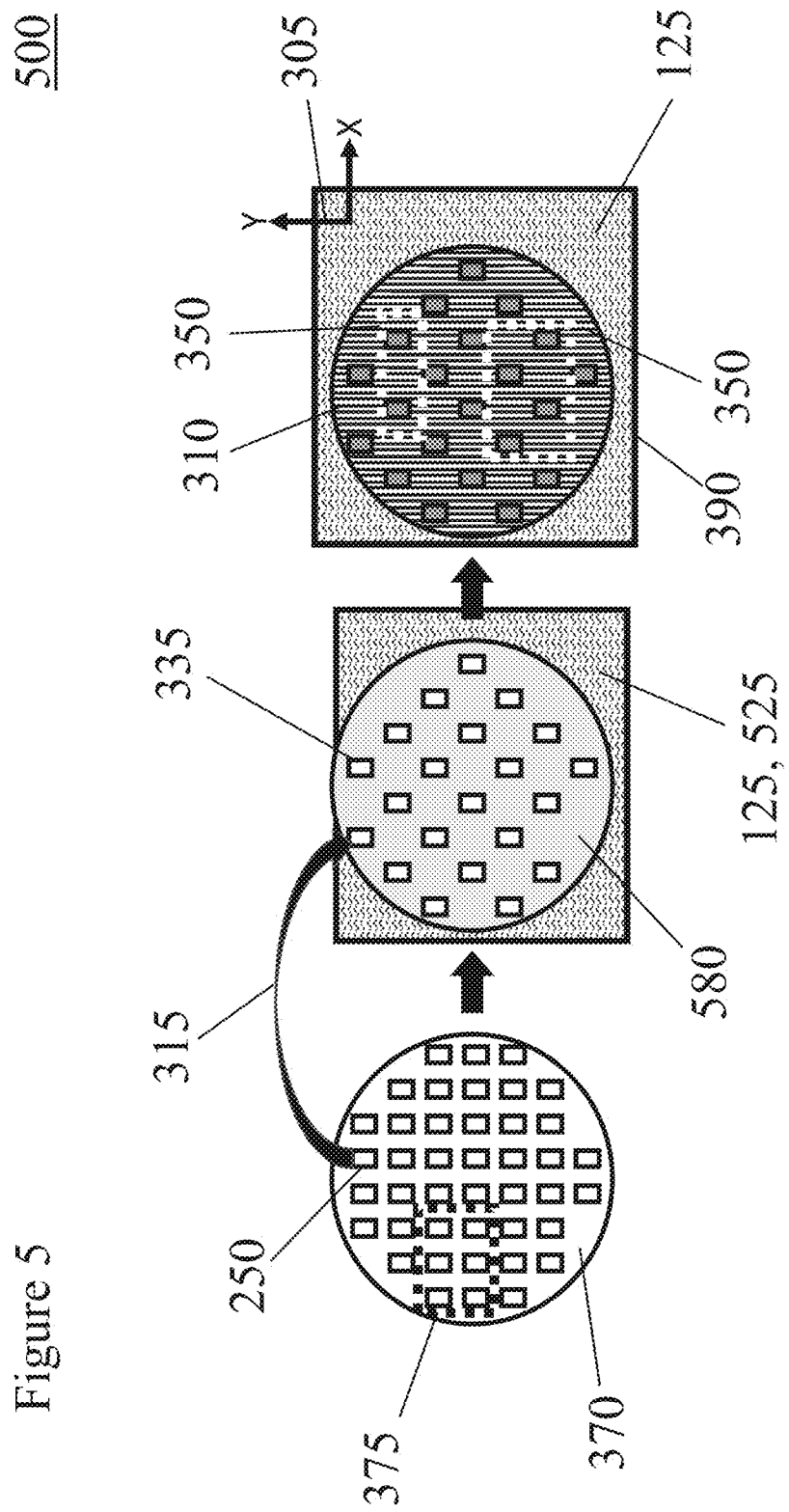
FIG. 5 is a sequence of wafer/panel level processing structures showing steps in a "die first" wafer/panel reconstitution and wafer/panel redistribution process.

FIG. 5 is a sequence of wafer/panel level processing structures 500 showing steps in a "die first" 500 wafer/panel reconstitution and wafer/panel redistribution process.

One or more source wafers 370 and/or source panels 370 have one or more parts 250 and/or part groupings 375. These source wafers/panels 370 can come from one or more vendors and/or supply chains. The parts 250 on these source wafers/panels 370 can be organized and/or grouped 375 as part groupings/patterns 375 on planar locations on the planar dimensions 305 of the source wafer/panels 370. In this way, individual parts 250 or part groups 375 can be singulated and/or selected from the source wafer/panel 370. The source wafer/panel 370 can have parts 250 of the same type, e.g. all dies 130, or can have different types of parts 250, e.g. dies 130, interposers 225, TSV dies 140, and/or components 230 which can be singulated individually or in groups 375.

In a die first process 500, a die first wafer reconstitution 580 is placed on a handler 125 (or die first handler 525). In the die first process 500, one or more dies 130 are first placed on the (die first 525) handler 125, e.g. by a transfer handler 325. For example, the dies 130 are placed on a de-bondable adhesive layer (not shown) disposed on the handler 125. The dies 130 and/or die groupings 375 are attached and orientated so that the die bottom external contacts 134 on a die bottom surface 135 are orientated "upward", e.g. away from the handler 125.

As before in the die last embodiment, one or more parts 250 and/or part groupings (or patterns) 375 is singulated from one or more source wafers/panels 370. The singulated parts 250 and/or part groupings/patterns 375 are picked and placed 315 on the reconstituted die first wafer 580 in the proper planar 305 location on the reconstituted die first wafer 580 and/or part(s) 250 previously placed during the wafer reconstitution 580. This is described in more detail in FIG. 6. Epoxy layers 170 can be added multiple times during the assembly or once before the RDL 110 is added.

Multi-stage testing 425 is performed as described above.

The RDL 310 is then added to form the redistributed wafer 590 with one or more redistributed parts 250 and/or redistributed part groupings/patterns 350. These redistributed parts 250 and/or redistributed part groups/patterns 350, e.g. with heterogeneous parts 250 can be tested, singulated, picked and placed, and electrically connected in larger scale WLP/PLP.

Figure 6:
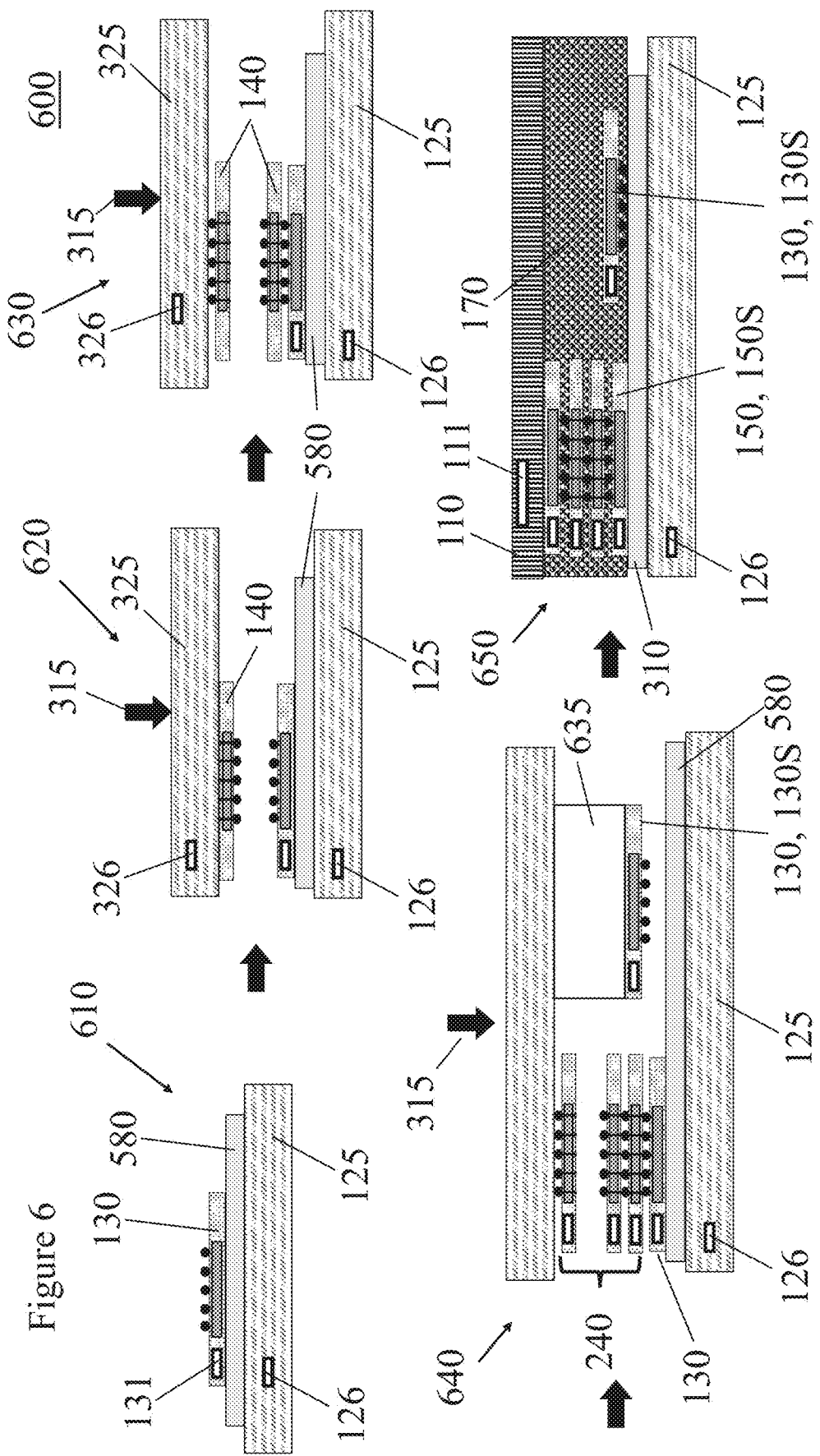
FIG. 6 is a sequence of structures showing steps in a "die first" wafer/panel reconstitution and wafer/panel redistribution process.

FIG. 6 is a sequence of structures 600 showing steps in a "die first" wafer/panel reconstitution and wafer/panel redistribution process.

Subassembly 610 is a die 130 attached to a reconstituted wafer 580 which is in turn attached to a handler 125. In alternative embodiments, the die 130 can be attached directly to the handler 125. The die 130 (and reconstituted wafer 580) are attached by adhesive layers (not shown) that can bond and de-bond by known processes. In the die first embodiment, the die 130 "faces up", i.e. the die bottom external contacts 134 are facing away from the reconstituted wafer 580 and/or handler 125 and toward one or more parts 250 that will be disposed after the die 130.

Subassembly 620 shows a transfer handler 325 picking and placing 315 one or more TSV dies 140 on the die 130, e.g. the top TSV die (140, 140T). The testing circuitry 326 in the transfer handler 325 enables testing of the TSV die 140 before it is incorporated into the subassembly 620 and/or after the TSV die is attached and connected to the die 130, e.g. in a test(s) of the subassembly 620.

Subassembly 630 shows a transfer handler 325 picking and placing 315 one or more "other" TSV dies 140 on one of the already placed TSV dies 140. The testing circuitry 326 in the transfer handler 325 enables testing of the "other" TSV die 140 before it is incorporated into the subassembly 630 and/or after the other TSV die 140 is attached and connected to the already placed TSV die 140, e.g. in a test(s) of the subassembly 630.

Subassembly 640 shows a transfer handler 325 picking and placing 315 one or more final or RDL TSV die (140, 140R) which is placed to complete the TSV die 240. Testing options are as described above and can be performed at any stage during the assembly by any test circuit (126, 131, 141, 326, etc.) or test type, e.g. BIST, function testing etc.

Subassembly 640 also shows the transfer handler 325 picking and placing 315 another die (130, 130S) forming a side-by-side configuration on the reconstituted wafer 580. An optional spacer 635 can be used to put parts in a proper vertical placement. Note that the side-by-side configuration can be made with one or more components 230 or other parts 250, as well.

Subassembly 650 is a completed side by side subassembly with a die stack (150, 150S) adjacent to a die (130, 130S). One or more epoxy layers 170 are disposed.

A RDL 110 with one or more RDL testing circuits 111 is layered on and completes the subassembly 650 and also completes the formation of the distributed wafer 390. The subassembly 650 can be a redistributed part 250 in a redistributed part group/pattern 350 on the distributed wafer 390.

Figure 7:
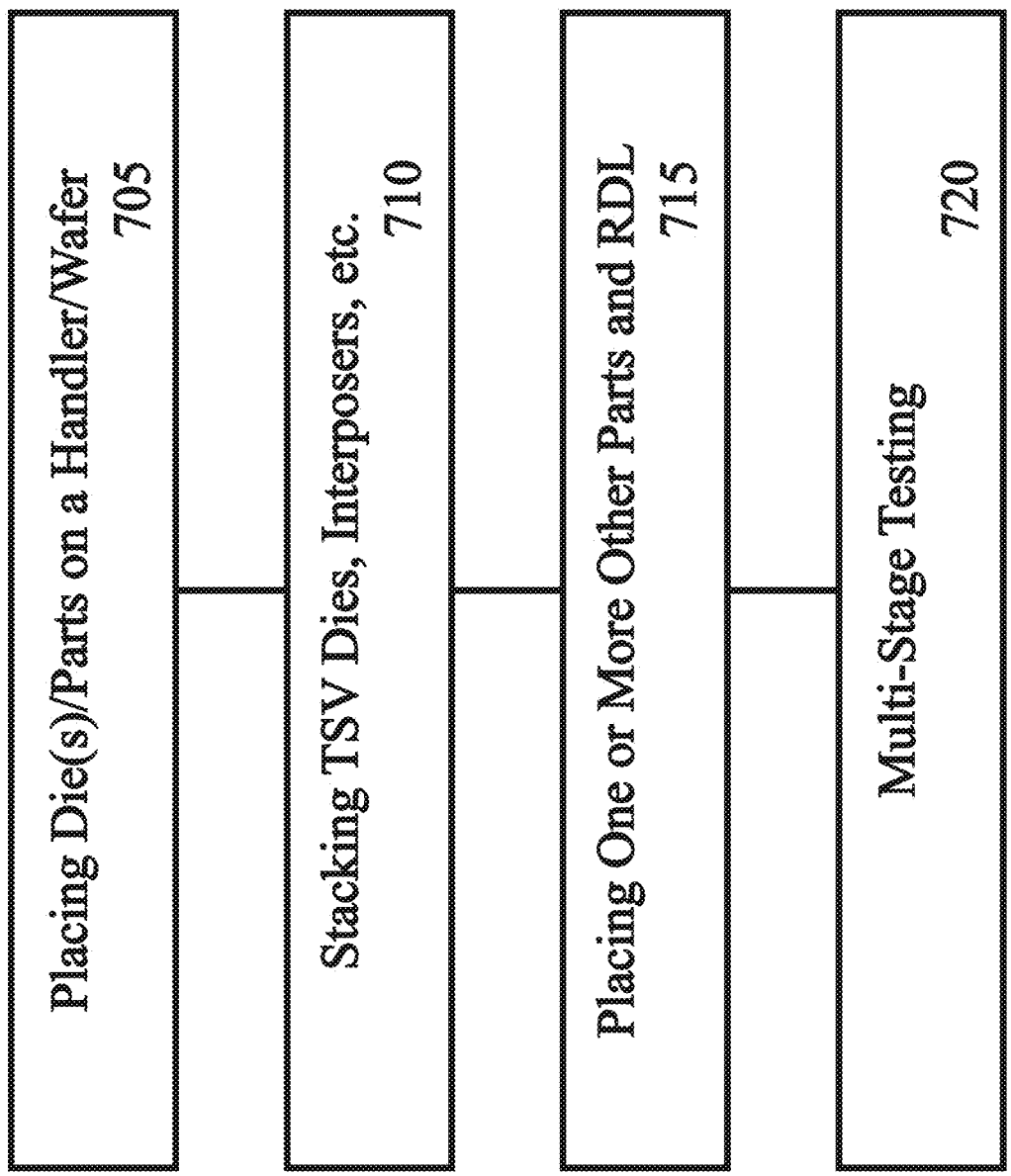
FIG. 7 is a flow chart of the steps of a "die first" wafer/panel reconstitution and wafer/panel redistribution process.

FIG. 7 is a flow chart of the steps of a "die first" wafer/panel reconstitution and wafer/panel redistribution process 700.

In step 705 of the wafer/panel redistribution process 700, one or more die(s) 130 or other parts, e.g. components 230, are singulated, picked and placed 315, positioned, and connected on the handler 125 or reconstituted wafer 580. In this die first process 700 the dies are placed and attached to the handler 125 or reconstituted wafer 580 in the face up position.

In steps 710 and 715, one or more TSV dies 140 are picked and placed 315 and connected to corresponding dies 130 on the handler 125/reconstituted wafer 580. Other parts 250 including dies 130, interposers 225, bridges 225, and/or components 230 can also be disposed on the handler 125/reconstituted wafer 580 as well. One or more epoxy layers 170 can be disposed on the handler 125/reconstituted wafer 580 at this point or, alternatively, the epoxy layer 170 disposition can occur after all parts 250 are placed. In some embodiments, the epoxy layer(s) 170 surrounds and attaches to all the TSV die 140 sides and all the die 130 sides. The epoxy layer 170 can be applied a single layer after an assembly (360, 365) is complete or near complete or at multiple times during assembly.

As before, multi-stage testing 720 is performed at one or more times during the die first wafer/panel reconstitution and wafer/panel redistribution process 700. For example, BIST is performed 720 by testing circuits (141, 131, 141, 226, etc.) embedded in one or more of the parts 250 before the part 250 is assembled. Testing 720 is also performed on one or more interim assemblies (e.g. subassemblies 610, 620, 630, 640, and 650) after each of one or more of the parts 250 is assembled. This testing can include testing of the individual part in addition to testing the subassemblies with the newly installed part 250.

Other non-limiting examples of times that tests are performed include after disposing 715 the RDL 110, after connecting one or more TSV dies 140, after connecting one or more dies 130, after connecting one or more interposing layers 225, after connecting one or more components 230, and after attaching one or more heat dissipation devices 268.

The same wafer/panel reconstitution and wafer/panel redistribution process 700 can be performed using parts 250 and/or part groupings 375 obtained from one or more source wafers/panels 370 and/or form redistributed parts 250 and/or redistributed part groupings 350, e.g. to create (heterogeneous) packages 150 and/or modules with heterogeneous parts.

Non-limiting examples of the tests include one or more of the following: a full functional test, a partial function test, a statistical test, an optical communication test, a subset test testing one or more components, a subset test testing one or more TSV dies, a subset test testing one or more dies, a heat transfer test, an "as-built" package test, a full package test, and a before installation of an expensive part test.

Figure 8:
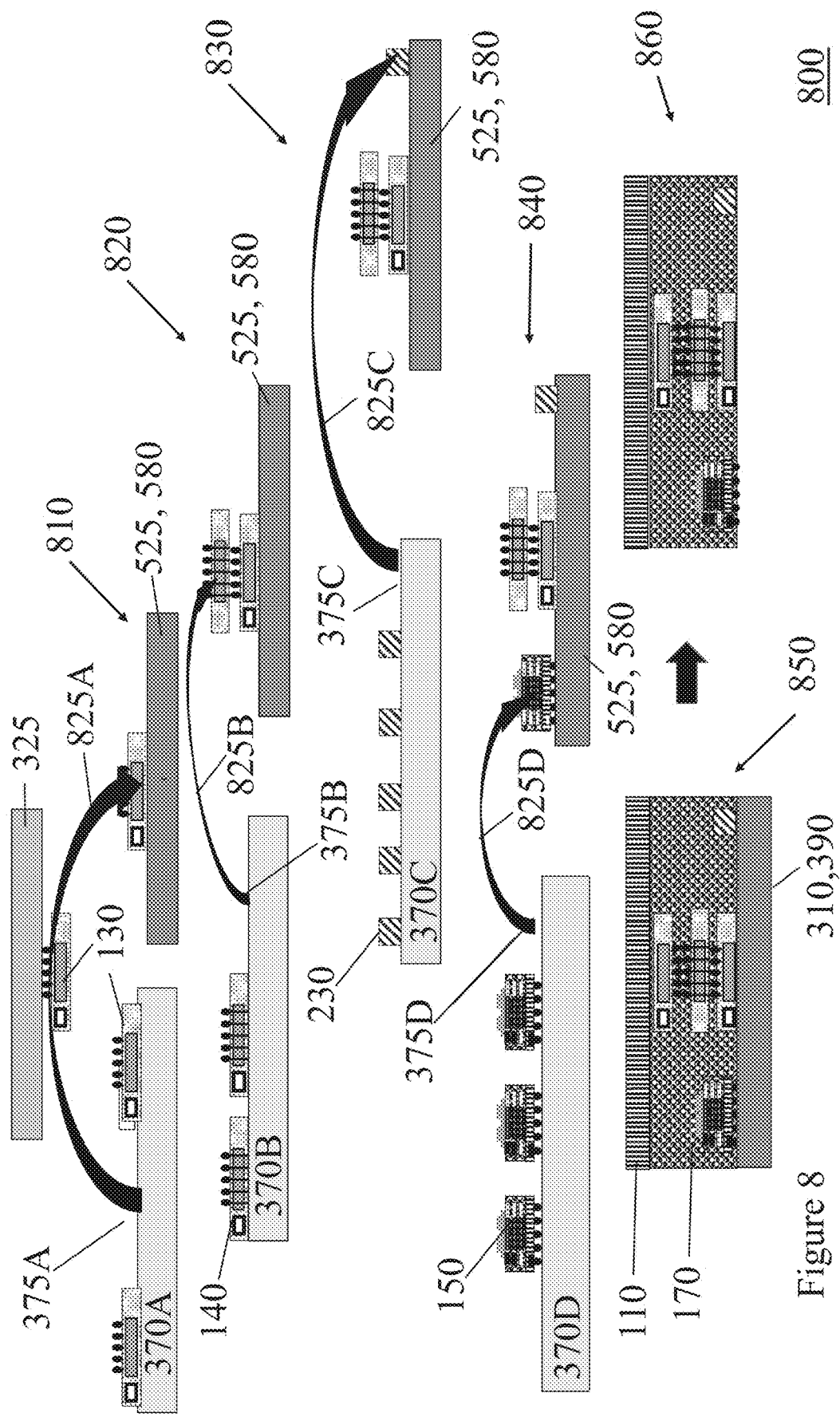
FIG. 8 is a sequence of structures showing steps in wafer/panel level processes to make packages/modules with heterogeneous parts from different vendors and/or supply chains.

FIG. 8 is a sequence of structures showing steps/stages (810, 820, 830, 840, 850, and 860) in wafer/panel level processes to make packages/modules with heterogeneous parts 800 using different source wafers/panels (370A, 370B, 370C, 370D, typically 370) from different vendors and/or supply chains. While this non-limiting example shows a "die first" method, a "die last" method can be employed, as described above. In addition, different stages and/or locations on the reconstituted wafer/handler (525, 580) can be constructed with a mixture of "die first" and "die last" techniques". In addition, as explained above, testing can be performed before a part 250 is place/connected, e.g. BIST, and/or before and/or after any stage in the process.

The process enables integration of two or more heterogeneous parts 250 on one or more reconstituted wafers/panels 580 and/or redistributed wafers/panels 390. Therefore, heterogeneous parts 250 can be selectively removed/singulated/debonded from locations, e.g. in a pattern 375, on a source wafers/panels 370 and transferred, e.g. picked in placed, 825 on a reconstituted wafer 580, e.g. by a transfer handler 325.

As a non-limiting example source wafer/panel (370A, 370) originates from one source and/or supply chain and carries one or more first dies 130 made by a first manufacture. At a first stage 810, one or more first dies 130 and/or one or more first die groups 130 is selectively removed/singulated/debonded from the first source wafer/panel 370A by known processes from a location(s) 375A on the first source wafer/panel 370A. A transfer handler 325 transfers 825A the one or more first dies 130 and/or first die groupings 130 to a reconstitution wafer 580 where they are placed and attached/connected.

In like manner one or more heterogeneous second parts 250 is transferred 825 from one or more second source wafer/panels 370 to the reconstituted wafer 580 part 250 by part 250 and/or part groups by part groups 250.

To continue the example, in a one or more second stages 820, source wafer/panel 370B originates from a TSV die 140 manufacture (or supply chain). One or more TSV dies 140 and/or TSV die groups 140 is removed from one or more locations 375B in one or more patterns 375B on the source wafer/panel 370B and transferred 825B to the reconstituted wafer 580. In some embodiments, the patterns/locations 375 are designed so one or more parts 250, even from different source wafers/panels 370, are stacked one upon the other, e.g. during the formation of a die stack 150.

One or more second stages 830 transfer 825C components 230 from one or more source wafer/panel 370B to the reconstituted wafer 580. Different source wafer/panels 370C can source different components 230 and/or groups of components 230 to be transferred 825C to the reconstituted wafer 580.

One or more second stages 810 can transfer 810C other dies, die types, and die groups 130 from different manufactures and/or supply chains to be transferred to the reconstituted wafer 580, for example to form side-by-side dies 130 on a bridge.

In some second stages 840 the source wafer/panel 370D provides one or more die stacks 150 and/or die stack groupings 150 that are transferred 825D from one or more locations/patterns 375D to locations on the reconstituted wafer 580. These die stacks 150 can also contain heterogeneous parts made by the processes describe herein.

When the reconstituted wafer 580 is complete, the epoxy layer(s) 170 and RDL 110 are created to form the redistributed wafer 390. (The epoxy 170 can be formed in one or more layers in one or more of the stages as described above.) In die last processes the order of part 250 placement and RDL 110 formation are different, as described above.

FIG. 9 is a flow chart of a process 900 for making packages/modules with heterogeneous parts 230 from multiple sources.

The process 900 begins with removing 905 one or more parts 250 from source wafers/panels 370 from locations 375. The parts can be removed by laser cutting and other known techniques. In some embodiments, the locations are in patterns of parts 250 so that the removed part 250 and/or part groups 250 are in a pre-defined pattern and location on the transfer handler 325. This ensures that these parts/part groups 250 are in a specific pattern and/or location on the reconstituted wafer 580 in relation to parts/part groups 250 that are places before and/or after the instant placement.

In some embodiments, precision optical and/or infrared (IR) cameras and algorithms are used with reference alignment marks to align the handle wafers, panels, and/or stacked handle components mounted on handle wafers or panels for precision x-y and z movement and placement. Tools exist to support one or multiple scanning ultraviolet (UV) and/or IR lasers for debonding, precision cutting/singulation, micro-machining, heating assembly and integration, and/or testing. Technology exists to support temporary bonding and debonding to thin dies 130, TSV dies 140, and substrates. Attachment and re-attachment to opposite side or same side a number of bond/debond times and release from wafers, die(s), and panels is known. For example, known technologies include UV/IR debonding lasers and associated release layer adhesives (e.g. glass to silicon, silicon to glass, glass to glass, silicon to glass, glass or silicon to gel pack, etc.).

In step 910 of the process, the removed parts/part groups are transferred to a reconstituted wafer 580 that is being built in multiple stages (e.g. 810, 820, 830, 840, 850, and 860). As stated above, one or more tests 925 can be performed before the part 250 is removed or picked/placed (e.g. BIST) and/or before, after or during any stage.

In step 915, the reconstituted wafer/panel(s) 580 are formed stage by stage.

In step 920, the redistributed wafer/panel 390 is completed by completing the epoxy layer(s) 170, RDL (110, 310), connections, and singulation.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. An electronic system comprising:
a redistribution layer (RDL), the RDL having one or more RDL top external contacts on a RDL top surface, one or more RDL bottom external contacts on a RDL bottom surface, one or more RDL singulation edges, and one or more fanout connections in the RDL, the fanout connections connecting one or more of the RDL top external contacts to one or more of the RDL bottom external contacts;
one or more die stacks, each die stack comprising:
one or more Through Silicon Via (TSV) dies, the TSV dies having one or more TSV top external contacts on a TSV top surface, one or more TSV bottom external contacts on a TSV bottom surface, one or more TSV die sides, and one or more TSV internal connections connecting to one or more of the TSV top external contacts and one or more of the TSV bottom external contacts, the TSV dies disposed on the RDL and one or more of the TSV bottom external contacts physically and electrically connected to a corresponding RDL top external contact;
a die having a die top surface, one or more die bottom external contacts on a die bottom surface, one or more die sides, and one or more die circuitries within the die, the die disposed on a top TSV die, the top TSV die being the TSV die disposed on a stack of one or more TSV dies and abutting the die, and one or more of the die bottom external contacts physically and electrically connected to a corresponding TSV top external contact of the top TSV die on which the die is disposed;
one or more part groupings being on the RDL, each of the part groupings having a reconstituted location, a reconstituted orientation, and a pattern of one or more heterogeneous parts, the pattern of one or more heterogeneous parts limited to a pattern of parts on a singulated section of a source wafer;

a dielectric or epoxy layer disposed on the RDL top surface and surrounding and attached to all the TSV die sides, one or more of the part groupings, and all the die sides;

one or more RDL testing circuits embedding in the RDL;

a TSV die test circuit contained in one or more of the TSV dies; and a die test circuit contained in the die.

2. A system, as in claim 1, where one of the part groupings is one or more adjacent die stacks disposed on the RDL side by side with the die stack and surrounded by and attached to the dielectric layer.

3. A system, as in claim 1, where one of the part groupings is one or more components disposed on the RDL.

4. A system, as in claim 1, where one of the part groupings is one or more interposers disposed as follows: between two TSV dies in a first die stack within the dielectric layer, between a TSV die and a die in a first die stack within the dielectric layer, between the RDL, and a TSV die within the dielectric layer, between the RDL, and a die within the dielectric layer, connecting a first TSV die and in a first die stack and an adjacent TSV die in an adjacent die stack within the dielectric layer, connecting a first die in a first die stack with an adjacent TSV in an adjacent die stack within the dielectric layer, connecting a first die and an adjacent die within the dielectric layer, and connecting a first die stack and an adjacent die.

5. A system, as in claim 4, where one or more of the interposers is one or more of the following: a silicon bridge, an organic bridge, a ceramic bridge, and a glass bridge.

6. A system, as in claim 4, where one or more tests circuits are in one or more of the following locations: one or more of the interposers, one or more of the adjacent TSV dies, one or more adjacent dies, and one or more handlers.

7. A system, as in claim 1, where a heat dissipation device is disposed on the die top surface of the die.

8. A system, as in claim 1, where a die first handler is attached to the die top surface or die bottom surface.

9. A system, as in claim 1, where a RDL first handler is attached to one or more of the following: a dielectric RILL, a silicon interposer, an organic interposer, a glass interposer, a ceramic interposer, an alternate packaging material.

10. A system, as in claim 1, where the die and TSV die have a thickness less than 800 micrometers (urn) and less than 30 um to 200 um, respectively.

11. The electronic system, as in claim 1, where the pattern of one or more heterogeneous parts comprises one or more first heterogeneous parts that is a first group of parts with a first pattern of parts on a first singulated section of a first source wafer, the first heterogeneous parts having a first reconstituted location and a first reconstituted orientation in the electric system and further comprises one or more second heterogeneous parts that is a second group of parts with a second pattern on a singulated section of a second source wafer, the second heterogeneous parts having a second reconstituted location and second reconstituted orientation in the electronic system.

12. The electronic system, as in claim 11, where the first group of parts contains TSV dies.

13. The electronic system, as in claim 11, where the first group of parts has identical parts.

14. The electronic system, as in claim 13, where the second group of parts has parts identical to the parts in the first group of parts.

15. The electronic system, as in claim 11, where the heterogeneous parts include one or more of the following: wafers, dies, chips, chipless, redistribution layer(s) (RDL), dielectric layers, dielectric through via (DTV) arrays, semiconductors, semiconductor packages, interposers, bridges, components, capacitors, light emitting diodes (LEDs), and vertical-cavity surface-emitting lasers (VCSELs).

16. The electronic system, as in claim 1, used in one or more of the following: an artificial intelligence (AI) systems and heterogeneous integration applications.

17. The electronic system, as in claim 1, further comprising one or more components disposed on the RDL, where one or more of the components is from a different vendor source.

18. The electronic system, as in claim 1, further comprising one or more heterogeneous parts adjacent to the RDL, the heterogeneous parts also being surrounded by the dielectric layer that also covers the parts and connects the parts to the RDL.

19. The electronic system, as in claim 18, where one or more of the heterogeneous parts is singulated.

* * * * *